United States Patent
King

(10) Patent No.: US 6,507,294 B1
(45) Date of Patent: Jan. 14, 2003

(54) SYSTEM AND METHOD FOR MEASURING PSEUDORANDOM NRZ DATA STREAM RATES

(75) Inventor: John Alfred King, Celina, TX (US)

(73) Assignee: Applied Micro Circuits Corporation, CA (US)

( * ) Notice: Subject to any disclaimer, the term of this patent is extended or adjusted under 35 U.S.C. 154(b) by 0 days.

(21) Appl. No.: 10/044,320

(22) Filed: Jan. 10, 2002

(51) Int. Cl.$^7$ ................................................. H03M 5/06
(52) U.S. Cl. ........................................... 341/68; 341/50
(58) Field of Search ........................... 341/50, 68, 69, 341/120

(56) References Cited

U.S. PATENT DOCUMENTS 5,689,799 A * 11/1997 Dougherty et al. ......... 455/2.01
6,266,799 B1 * 7/2001 Lee et al. ....................... 716/6

* cited by examiner

Primary Examiner—Peguy JeanPierre
(74) Attorney, Agent, or Firm—Law Office of Gerald Maliszewski; Gerald Maliszewski; Paul Maliszewski

(57) ABSTRACT

A system and method are provided for measuring pseudorandom non-return to zero (NRZ) data rates in a communications device integrated circuit (IC). The system comprises a transition detector to sample a pseudorandom NRZ data stream and to supply a mean frequency of transitions (Fd). A probability analyzer receives the mean frequency of transitions, compares the mean frequency of transitions to a transition probability (P), and supplies a derived mean data stream rate (B), where B=Fd/P. In some aspects of the system, a gating circuit is included to supply a gate time period (Td). Then, the probability analyzer receives the gate time period, compares a mean transition count of the mean frequency of transitions to a transition probability (P), and supplies a compensated transition count (Nc), where Nc=Np/P. A system for selecting the frequency range of a VCO, for use in pseudorandom NRZ communications, is also disclosed.

25 Claims, 3 Drawing Sheets

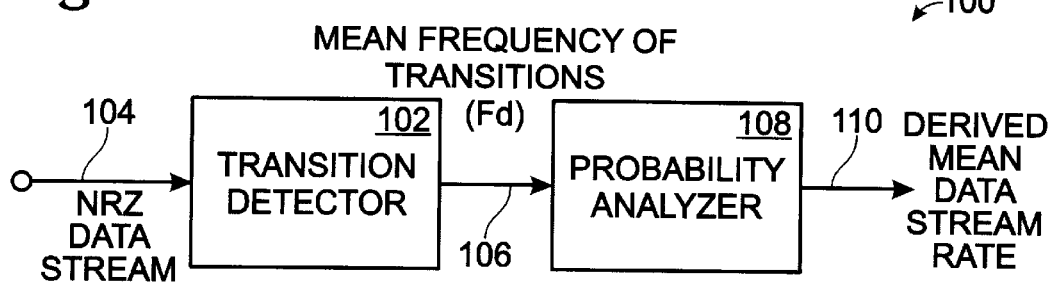
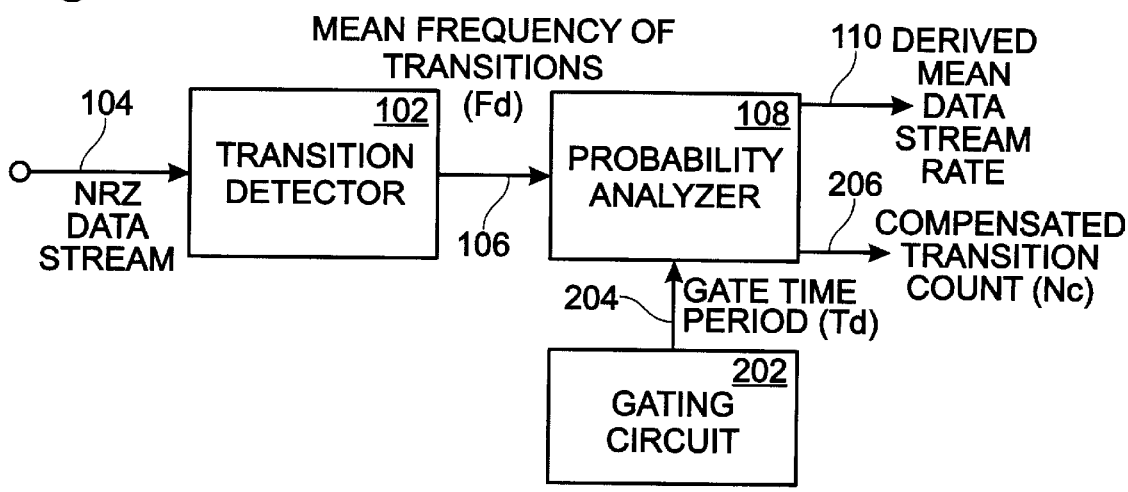
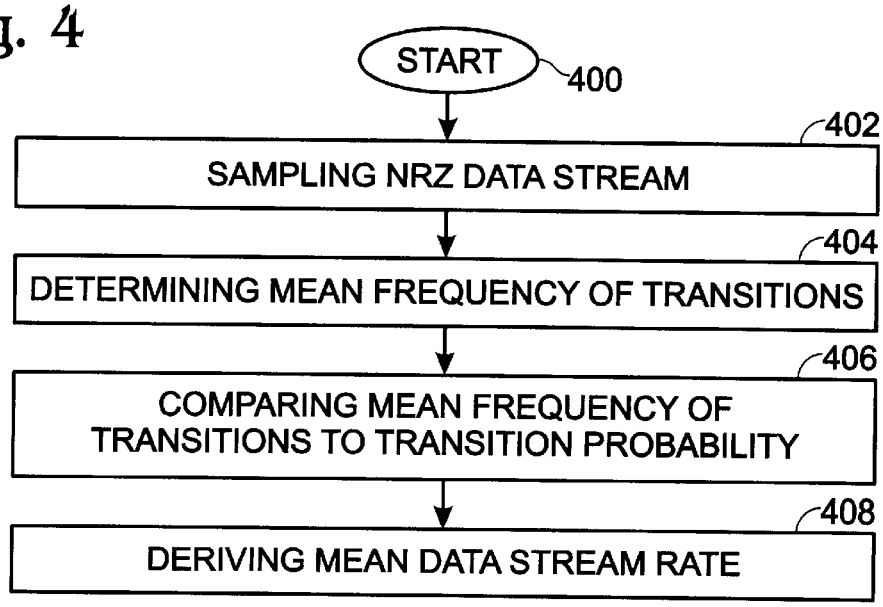

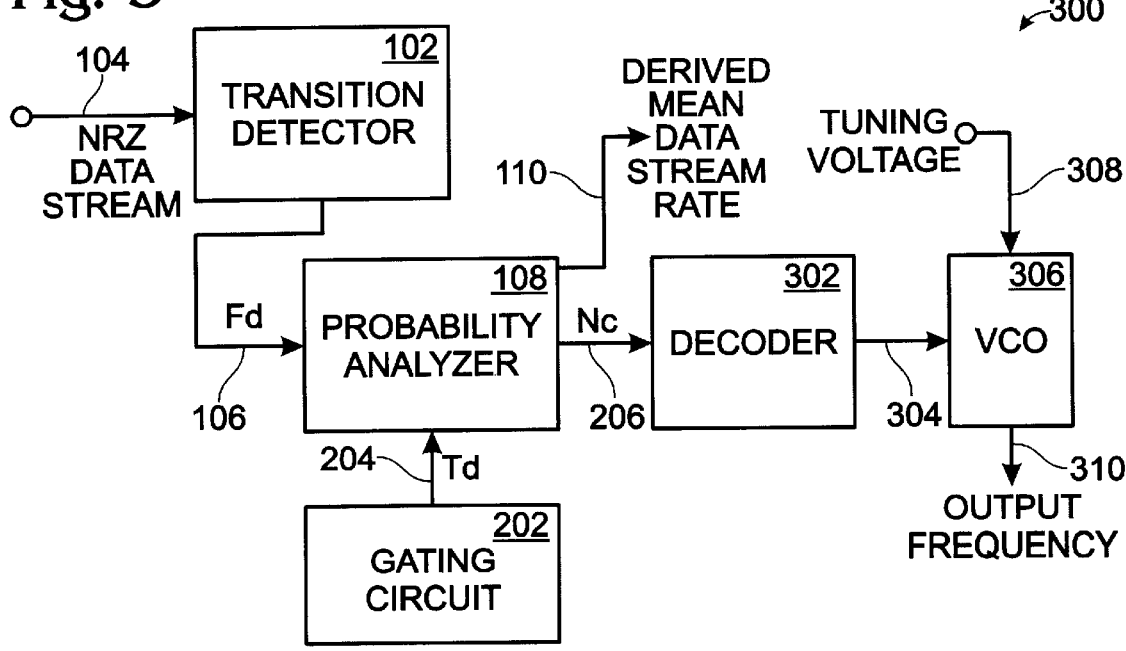
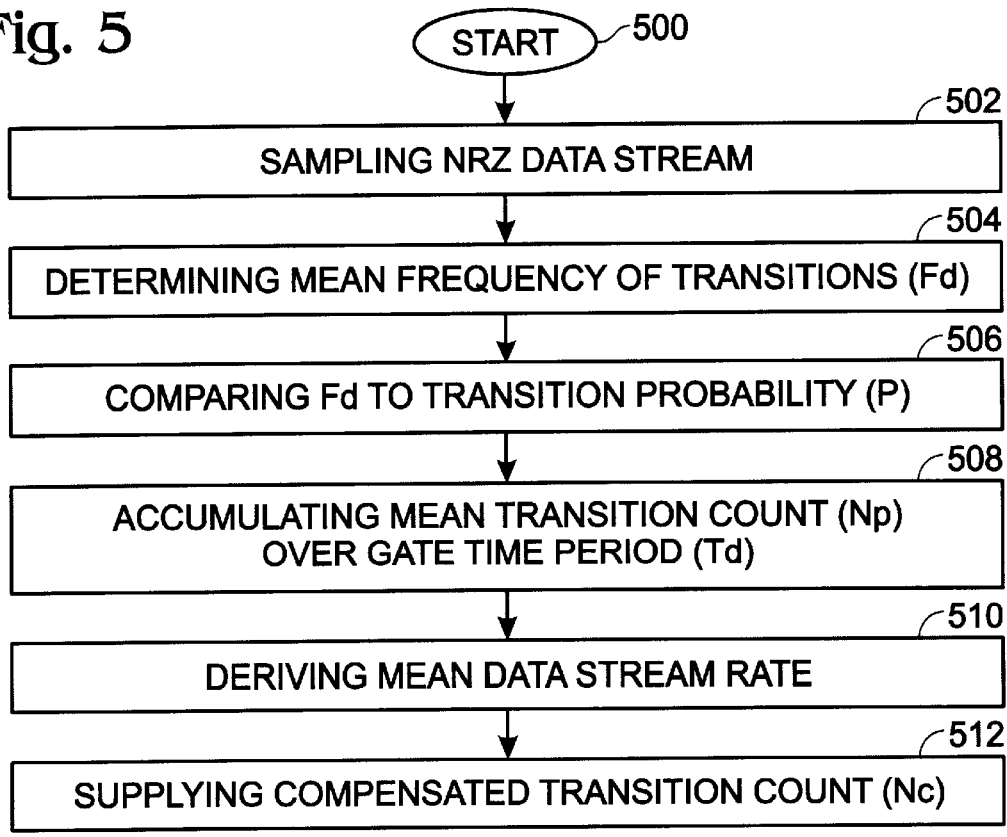

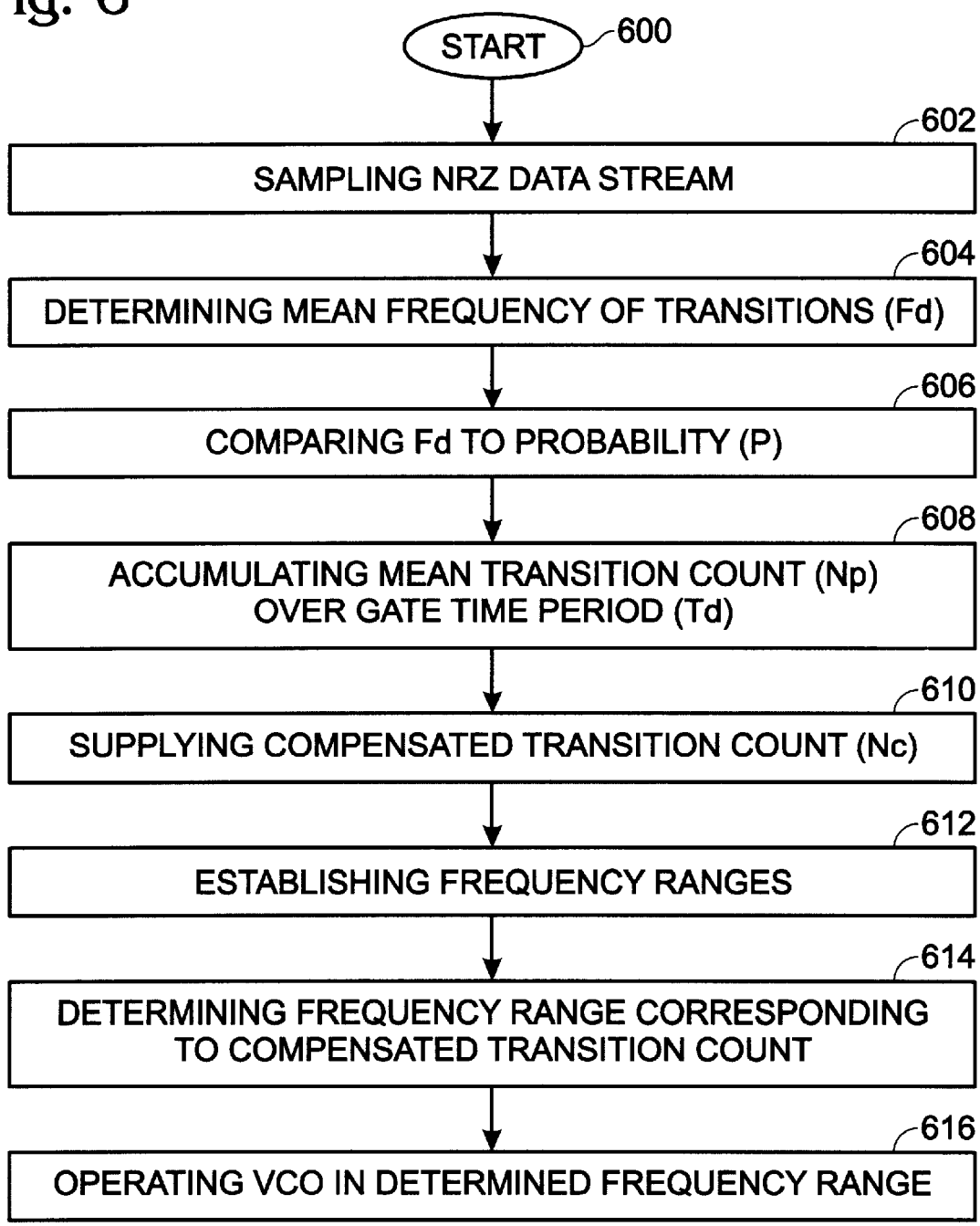

SYSTEM AND METHOD FOR MEASURING PSEUDORANDOM NRZ DATA STREAM RATES

BACKGROUND OF THE INVENTION

1. Field of the Invention

This invention generally relates to binary non-return to zero (NRZ) communications and, more particularly, to a system and method for determining the mean NRZ data stream rate. Additionally, applications of the NRZ data stream rate determination process are presented for acquiring voltage controlled oscillator (VCO) frequency ranges.

2. Description of the Related Art

Voltage controlled ring oscillators are commonly used in monolithic clock data recovery (CDR) units, as they're easy to fabricate and provide reliable results. Ring oscillators obtain their tuning characteristics by changing the variable delay around the ring, usually in response to a dedicated control voltage input (tuning voltage). Voltage controlled ring oscillators can, and usually do exhibit a tuning range much wider than the closed loop phase-locked loop (PLL) bandwidth of the circuits in which they operate.

Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL isn't locked to a data stream, the PLL switches over to a PFD that is driven by a stable reference clock source. The reference clock frequency is approximately equal to the data stream rate. Thus, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

It would be advantageous if the mean data rate of an NRZ data stream could be simply measured.

It would be advantageous if a CDR or a clock synthesis unit (CSU) had the ability to operate over a broad range of clock frequencies using simple data rate analysis circuitry.

SUMMARY OF THE INVENTION

The present invention automatic data stream rate measuring system can be used as an acquisition aid for phase-locked loops in clock recovery applications. The system examines transitions in the data stream, counting those events in a given time frame, or logging the time required to accumulate a fixed count. Whether it be time or event counting, the results can be decoded into frequency band information pulling the VCO frequency into the correct range of operation, establishing a reference clock frequency for support during serial data outages, and enabling clock recovery action on the data stream.

Accordingly, a system is provided for measuring pseudorandom non-return to zero (NRZ) data rates in a communications device integrated circuit (IC). The system comprises a transition detector to sample a pseudorandom NRZ data stream and to supply a mean frequency of transitions (Fd). The system further comprises a probability analyzer to receive the mean frequency of transitions, compare the mean frequency of transitions to a transition probability (P), and supply a derived mean data stream rate. The probability analyzer supplies the derived mean data stream rate (B) as follows:

$$B = Fd/P.$$

The transition detector can be set to supply a mean frequency of transitions (Fd) in response to one of the following: positive transitions having a 0.25 probability of occurrence; negative transitions having a 0.25 probability of occurrence; and, both positive and negative transitions having a 0.5 probability of occurrence. The transition detector samples a pseudorandom NRZ data stream includes sampling n data bits, and the probability analyzer derives the mean data stream rate with a standard deviation as follows:

$$\sigma = SQRT((P)(1-P)(n)).$$

In some aspects of the system, a gating circuit is included to supply a gate time period (Td). Then, the probability analyzer receives the gate time period, compares a mean transition count of the mean frequency of transitions to a transition probability (P), and supplies a compensated transition count (Nc) as follows:

$$Nc = Np/P.$$

The probability analyzer generates a mean transition count (Np) of frequency transitions over the time period Td and derives a mean data stream rate (B) as follows:

$$B = (Np)/(Td)(P).$$

In a system for selecting the frequency range of a VCO for use in pseudorandom NRZ communications, the system further comprises a decoder to accept the compensated transition count, determine a frequency range corresponding to the compensated transition count, and supply a frequency range selection command at an output. The system further comprises a multiband voltage controlled oscillator having an input to accept a tuning voltage, an input to accept the frequency range selection command, and an output to supply a voltage controlled oscillator frequency responsive to the tuning voltage and frequency range selection.

Additional details of the above-described system, and a method for measuring a mean NRZ data stream rate are presented below in greater detail.

BRIEF DESCRIPTION OF THE DRAWINGS

FIG. 1 is a schematic block diagram of the present invention system for measuring pseudorandom non-return to zero (NRZ) data rates in a communications device IC.

FIG. 2 is a schematic block diagram of another aspect of the present invention, a system for measuring a pseudorandom NRZ data transition count.

FIG. 3 is a schematic block diagram of the present invention system for selecting the frequency range of a voltage controlled oscillator for use in pseudorandom NRZ communications.

FIG. 4 is a flowchart illustrating the present invention method for measuring pseudorandom NRZ data rates in a communications device.

FIG. 5 is a flowchart illustrating the present invention method for measuring a pseudorandom NRZ transition count in a communications device.

FIG. 6 is a flowchart illustrating the present invention method for selecting the frequency range of a VCO for use in pseudorandom NRZ communications.

DETAILED DESCRIPTION OF THE PREFERRED EMBODIMENTS

FIG. 1 is a schematic block diagram of the present invention system for measuring pseudorandom non-return to zero (NRZ) data rates in a communications device IC. The system 100 comprises a transition detector 102 having an input on line 104 to sample a pseudorandom NRZ data stream and an output on line 106 to supply a mean frequency of transitions (Fd). A probability analyzer 108 has an input on line 106 to receive the mean frequency of transitions. The probability analyzer 108 compares the mean frequency of transitions to a transition probability (P) and supplies a derived mean data stream rate at an output on line 110. The relationship between the transition probability and the frequency of transitions is explored in greater detail below.

The probability analyzer 108 supplies the derived mean data stream rate (B) as follows:

$$B=Fd/P.$$

As is well understood, the NRZ data stream transitions between analog high and low voltages, which are interpreted as digital ones and zeros. The transition detector 102 can be operated in any one of three basic modes. The mean frequency of transitions (Fd) can be derived from positive transitions having a 0.25 probability of occurrence, negative transitions having a 0.25 probability of occurrence, or both positive and negative transitions having a 0.5 probability of occurrence.

The transition detector 102 samples a pseudorandom NRZ data stream on line 104 that includes n data bits. In response, the probability analyzer 108 derives the mean data stream rate with a standard deviation as follows:

$$\sigma=SQRT((P)(1-P)(n)).$$

FIG. 2 is a schematic block diagram of another aspect of the present invention, a system for measuring a pseudorandom NRZ data transition count. The system 200 comprises a transition detector 102 and a probability analyzer 108, as explained above in the description of FIG. 1. The system 200 further comprises a gating circuit 202 having an output on line 204 to supply a gate time period (Td). The probability analyzer 108 has an input to receive the mean frequency of transitions on line 106 and an input to accept the gate time period on line 204. The probability analyzer 108 compares a mean transition count of the mean frequency of transitions to a transition probability (P) and supplies a compensated transition count at an output on line 206.

The probability analyzer 108 generates a mean transition count (Np) of frequency transitions over the time period Td and derives a mean data stream rate (B) on line 110 as follows:

$$B=(Np)/(Td)(P).$$

The probability analyzer supplies a compensated transition count (Nc) on line 206 as follows:

$$Nc=Np/P.$$

As above, the transition detector 102 supplies a mean frequency of transitions selected from the group including: positive transitions having a 0.25 probability of occurrence; negative transitions having a 0.25 probability of occurrence; or, both positive and negative transitions having a 0.5 probability of occurrence.

The transition detector 102 samples a pseudorandom NRZ data stream of n data bits on line 104, and the probability analyzer 108 supplies a compensated transition count (Nc) on line 206 with a standard deviation as follows:

$$\sigma=SQRT((P)(1-P)(n)).$$

FIG. 3 is a schematic block diagram of the present invention system for selecting the frequency range of a voltage controlled oscillator for use in pseudorandom NRZ communications. The system 300 comprises a transition detector 102, a gating circuit 202, and a probability analyzer 108 as explained above in the description of FIG. 2. The system 300 further comprises a decoder 302 having a input to accept the compensated transition count on line 206. The decoder 302 determines a frequency range corresponding to the compensated transition count and supplies a frequency range selection command at an output on line 304. A multiband voltage controlled oscillator (VCO) 306 has an input on line 308 to accept a tuning voltage, an input on line 304 to accept the frequency range selection command, and an output on line 310 to supply a voltage controlled oscillator frequency responsive to the tuning voltage and frequency range selection on lines 308 and 310, respectively.

As above, the probability analyzer 108 generates a mean transition count (Np) of frequency transitions over the time period Td and derives a mean data stream rate (B) on line 110 as follows:

$$B=(Np)/(Td)(P).$$

Functional Description of the System

The invention described herein provides a means of identifying the transmission rate of a binary NRZ data stream, based on direct measurement of unique statistical properties of transition density. The invention enables a method of fast, accurate and non-invasive identification of the transmission rate. The invention has applications in wide range clock recovery devices, providing a numerical approach to data rate identification.

The invention takes advantage of certain statistical properties NRZ data streams with random or pseudorandom characteristics. Accumulated statistics have a direct correlation to data transmission rate, in bits/second. The basis for auto rate detection, also referred to herein as measuring the derived mean data stream rate, is supported by simple rules of probability. In terms of bit probabilities, transitions are statistically unique events in a random bit sequence.

Consider a stream of random binary data with equal probability of one or zero in any sample. By definition, positive transitions are a zero bit followed by a one bit. Therefore, the probability (P) of a positive transition is 0.250. With n n-bit sample, the mean positive transition count is n/4, with diminishing uncertainty with large n. The same reasoning applies to measurements using negative transitions.

In practice, the probability analyzer accumulates a count of positive transitions (Np) from a data stream, using a controlled gating time Td. Known accumulation time is essential to estimating the incoming serial data rate. The following relationship exists between the unknown serial data rate B, transition count Np, and the gating time Td:

$$B=(P)(Np)(Td).$$

To maintain a low level of measurement uncertainty, the bit sample size should be large. Np>250K represents a sample of about 1 million bits. Empirical data shows 6 sigma limits of +/−0.2% with a sample of 1 million bits. In general, the standard deviation, in units of (B)(P) is:

$$\sigma = SQRT\ (n \cdot P \cdot q),$$

where n is the count length, P=0.25 is the probability of a positive transition and q=(1−P) is the probability of not detecting a positive transition.

There are two ways to implement rate identification. One method accumulates and reports Np for a known gating time. Another method reports the time required to accumulate a predetermined Np count. The fixed Np method insures constant measurement uncertainty at the expense of increased gating time for lower serial bit rates.

Simulations show the number of positive transitions is either equal to, or within one count of the number of negative transitions. Computer simulations using a random number generator, producing run lengths of 1E6 bits, consistently yield around 250K positive transitions. The six-sigma standard deviation of 17 separate runs was 0.2%. It is reasonable to assume that the positive transition count for N random bits is about 0.248*N to 0.252*N.

Lab experiments were conducted to test the theory against actual data streams of two types; synchronous optical network (SONET) and pure pseudorandom bit stream (PRBS). An Agilent 8133A Pulse Generator, equipped with a limited resolution frequency counter, was used to complete the measurements because it exhibited good low frequency response. The frequency display had six digits and the gating time is estimated to be 100 milliseconds (mS). "x" indicates the digit is unstable.

TABLE 1

| | SONET Payload PRBS Length | | | | |
|---|---|---|---|---|---|
| | n = 11 | n = 15 | n = 23 | All Zeroes | All Ones |
| STS3 | 38.9x | 38.9x | 38.9x | 39.16x | 39.17x |
| STS12 | 155.3x | 155.3x | 155.3x | 155.55x | 155.6x |
| STS48 | 622.1x | 622.1x | 622.x | 626.88x | 626.91x |
| | PRBS Length | | | | |
| | n = 7 | n = 10 | n = 15 | n = 23 | n = 31 |
| STS3 | 39.185x | 38.917x | 38.88x | 38.88x | 38.8x |
| STS12 | 156.75x | 155.67x | 155.53x | 155.52x | 155.5x |
| STS48 | 626.98x | 622.69x | 622.10x | 622.080x | 622.x |

The table below (Table 2) shows the theoretical frequency range of positive transitions for popular data rates. Note that measured data fits comfortably in the range predicted by theory and simulation results. DW stands for digital wrapper. One form of the digital wrapper format is described in the International Telecommunications Union ITU-T G.709 (G.709) specification.

TABLE 2

| Service | Line Rate | Fp (min) | Fp (nom) | Fp (max) |
|---|---|---|---|---|
| STS4S + DW | 2666.057 | 661.182 | 666.514 | 671.846 |
| STS48 | 2488.320 | 617.103 | 622.080 | 627.057 |
| STS12 + DW | 666.514 | 165.296 | 166.629 | 167.962 |
| STS12 | 622.080 | 154.276 | 155.520 | 156.764 |
| STS3 + DW | 166.629 | 41.324 | 41.657 | 41.990 |
| STS3 | 155.520 | 38.569 | 38.880 | 39.191 |

In practice, auto rate detection acquires a direct count of positive transitions from the incoming data stream, without retiming or any form of signal processing. A time base is required to control count gating however. The time base stability need only be about 200 parts per million (ppm) or less for the short term gating interval.

With respect to FIG. 3, the present invention data stream rate measuring system is useful for devices with a wide VCO tuning range, partitioned into subsets of frequency bands. The width of each band and the phase-locked loop (PLL), not shown, acquisition characteristics are such that the VCO can acquire lock to any data rate that falls in the band. The derived mean data stream rate provides sufficient information to direct VCO band switching action.

High order bits of the gated counter are decoded into band select information. The VCO is directed to the correct frequency band as a function of incoming data stream statistics. To maintain confidence in the count, the counter should accumulate at least 1 E6 bits at the lowest data rate. High-order bits of the counter are used by the band selection decoder.

In general, the data rate B is identified numerically by the unique positive transition count associated with the rate, i.e., mean positive transition count is (B)(P). The mean transition count is decoded into frequency bands. In some aspects, the frequency bands are kept less than 1 octave wide to prevent false locking by the PLL.

Operating Considerations

Several practical limits might be considered for successful implementation of the present invention. With respect to power conservation, the transition detector, probability analyzer, and gating circuit may be operated continuously or enabled on demand for power conservation. A dedicated control pin on the IC could allow the circuitry to be operated continuously or only during a loss of signal (LOS) recovery.

Then, data stream rate measurement is initiated when the LOS alarm goes from active to the inactive state, indicating the presence of serial input data. The data stream rate measuring circuitry runs until 4 consecutive gating intervals with equal counts are detected. When this condition is met the probability analyzer loads the decoder with transition count data, forcing the VCO to the appropriate frequency band and disabling circuits associated with the transition counting.

There are at least two ways to process line rate changes. Taking the LOS alarm from active to inactive status initiates new rate acquisition. If the transition counter is always online, it detects rate changes and updates band decode logic after 4 consecutive gate periods with equal counts. When the LOS bit goes to the active state, transition counters are disabled to avoid translating optical receiver thermal noise events.

In frequency agile applications it is important to note that a frequency reference isn't established until a PLL acquires lock to a valid serial data stream. At power-on with no serial input data, there is no reference. Applying serial data and taking the LOS bit from active to inactive state initiates rate identification and subsequent locking to the data stream.

FIG. 4 is a flowchart illustrating the present invention method for measuring pseudorandom NRZ data rates in a communications device. Although the method (and the methods described by FIGS. 5 and 6 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 400. Step 402 samples a pseudorandom NRZ data stream. Step 404 determines a mean frequency of transitions (Fd) in the data stream. Step 406 compares the mean frequency of transitions to a first transition probability (P). Step 408 derives the mean data stream rate from the comparison.

In some aspects, deriving the mean data stream rate from the comparison in Step 408 includes obtaining the mean data stream rate (B) as follows:

$$B=Fd/P.$$

Determining a mean frequency of transitions (Fd) in the data stream in Step 404 includes determining the frequency of transitions selected from the group including: positive transitions having a 0.25 probability of occurrence; negative transitions having a 0.25 probability of occurrence; or, both positive and negative transitions having a 0.5 probability of occurrence.

In some aspects of the method, sampling a pseudorandom NRZ data stream in Step 402 includes sampling n data bits. Then, deriving the mean data stream rate from the comparison in Step 408 includes deriving the mean data stream rate with a standard deviation as follows:

$$\sigma=SQRT((P)(1-P)(n)).$$

FIG. 5 is a flowchart illustrating the present invention method for measuring a pseudorandom NRZ transition count in a communications device. The method starts at Step 500. Step 502 samples a pseudorandom NRZ data stream. Step 504 determines a mean frequency of transitions (Fd) in the data stream. Step 506 compares the mean frequency of transitions to a first transition probability (P). Step 508 accumulates a mean transition count (Np) of frequency transitions over a gate time period (Td). Step 510 derives the mean data stream rate (B) from the comparison as follows:

$$B=Np/(Td)(P).$$

Some aspects of the method include a further step. Step 512 supplies a compensated transition count (Nc) as follows:

$$Nc=Np/P.$$

Determining the mean frequency of transitions (Fd) in the data stream in Step 504 includes determining the frequency of transitions selected from the group including: positive transitions having a 0.25 probability of occurrence; negative transitions having a 0.25 probability of occurrence; or, both positive and negative transitions having a 0.5 probability of occurrence.

In some aspects, sampling a pseudorandom NRZ data stream in Step 502 includes sampling n data bits. Then, supplying a compensated transition count (Nc) in Step 512 includes deriving the compensated transition count with a standard deviation as follows:

$$\sigma=SQRT((P)(1-P)(n)).$$

FIG. 6 is a flowchart illustrating the present invention method for selecting the frequency range of a VCO for use in pseudorandom NRZ communications. The method starts at Step 600. Step 602 samples a pseudorandom NRZ data stream. Step 604 determines a mean frequency of transitions (Fd) in the data stream. Step 606 compares the mean frequency of transitions to a first transition probability (P). Step 608 accumulates a mean transition count (Np) of frequency transitions over a gate time period (Td). Step 610 supplies a compensated transition count (Nc), where Nc=Np/P. Step 612 establishes a plurality of frequency ranges. Step 614 determines a frequency range corresponding to the compensated transition count. Step 616 operates the voltage controlled oscillator within the determined frequency range.

Determining the mean frequency of transitions (Fd) in the data stream in Step 604 includes determining the frequency of transitions selected from the group including: positive transitions having a 0.25 probability of occurrence; negative transitions having a 0.25 probability of occurrence; or, both positive and negative transitions having a 0.5 probability of occurrence.

In some aspects, sampling a pseudorandom NRZ data stream in Step 602 includes sampling n data bits. Then, supplying a compensated transition count (Nc) in Step 610 includes deriving the compensated transition count with a standard deviation as follows:

$$\sigma=SQRT((P)(1-P)(n)).$$

A system and method have been provided of measuring a pseudorandom NRZ data stream rate. A VCO frequency range selection application of the measuring system has also been given. However, the present invention system and method have a wider field of use than just these limited number of examples. Neither is the invention limited to any particular communication format. Other variations and embodiments of the invention will occur to those skilled in the art.

I claim:

1. In a communications device, a method for measuring pseudorandom non-return to zero (NRZ) data rates, the method comprising:

sampling a pseudorandom NRZ data stream;

determining a mean frequency of transitions (Fd) in the data stream;

comparing the mean frequency of transitions to a first transition probability (P); and, deriving the mean data stream rate from the comparison.

2. The method of claim 1 wherein deriving the mean data stream rate from the comparison includes obtaining the mean data stream rate (B) as follows:

$$B=Fd/P.$$

3. The method of claim 2 wherein determining a mean frequency of transitions (Fd) in the data stream includes determining the frequency of transitions selected from the group including:

positive transitions having a 0.25 probability of occurrence;

negative transitions having a 0.25 probability of occurrence; and, both positive and negative transitions having a 0.5 probability of occurrence.

4. The method of claim 3 wherein sampling a pseudorandom NRZ data stream includes sampling n data bits;
wherein deriving the mean data stream rate from the comparison includes deriving the mean data stream rate with a standard deviation as follows:

$\sigma = SQRT((P)(1-P)(n))$.

5. In a communications device, a method for measuring a pseudorandom non-return to zero (NRZ) transition count, the method comprising:
sampling a pseudorandom NRZ data stream;
determining a mean frequency of transitions (Fd) in the data stream;
comparing the mean frequency of transitions to a first transition probability (P);
accumulating a mean transition count (Np) of frequency transitions over a gate time period (Td); and,
deriving the mean data stream rate (B) from the comparison as follows:

$B = Np/(Td)(P)$.

6. The method of claim 5 further comprising:
supplying a compensated transition count (Nc) as follows:

$Nc = Np/P$.

7. The method of claim 6 wherein determining the mean frequency of transitions (Fd) in the data stream includes determining the frequency of transitions selected from the group including:
positive transitions having a 0.25 probability of occurrence;
negative transitions having a 0.25 probability of occurrence; and,
both positive and negative transitions having a 0.5 probability of occurrence.

8. The method of claim 7 wherein sampling a pseudorandom NRZ data stream includes sampling n data bits;
wherein supplying a compensated transition count (Nc) includes deriving the compensated transition count with a standard deviation as follows:

$\sigma = SQRT((P)(1-P)(n))$.

9. A method for selecting the frequency range of a voltage controlled oscillator (VCO) for use in pseudorandom non-return to zero (NRZ) communications, the method comprising:
sampling a pseudorandom NRZ data stream;
determining a mean frequency of transitions (Fd) in the data stream;
comparing the mean frequency of transitions to a first transition probability;
accumulating a mean transition count (Np) of frequency transitions over a gate time period (Td);
supplying a compensated transition count (Nc), where Nc=Np/P;
establishing a plurality of frequency ranges;
determining a frequency range corresponding to the compensated transition count; and,
operating the voltage controlled oscillator within the determined frequency range.

10. The method of claim 9 wherein determining the mean frequency of transitions (Fd) in the data stream includes determining the frequency of transitions selected from the group including:
positive transitions having a 0.25 probability of occurrence;
negative transitions having a 0.25 probability of occurrence; and,
both positive and negative transitions having a 0.5 probability of occurrence.

11. The method of claim 10 wherein sampling a pseudorandom NRZ data stream includes sampling n data bits;
wherein supplying a compensated transition count (Nc) includes deriving the compensated transition count with a standard deviation as follows:

$\sigma = SQRT((P)(1-P)(n))$.

12. In a communications device integrated circuit (IC), a system for measuring pseudorandom non-return to zero (NRZ) data rates, the system comprising:
a transition detector having an input to sample a pseudorandom NRZ data stream and an output to supply a mean frequency of transitions (Fd); and,
a probability analyzer having an input to receive the mean frequency of transitions, the probability analyzer comparing the mean frequency of transitions to a transition probability (P) and supplying a derived mean data stream rate at an output.

13. The system of claim 12 wherein the probability analyzer supplies the derived mean data stream rate. (B) as follows:

$B = Fd/P$.

14. The system of claim 13 wherein the transition detector supplies a mean frequency of transitions (Fd) selected from the group including:
positive transitions having a 0.25 probability of occurrence;
negative transitions having a 0.25 probability of occurrence; and,
both positive and negative transitions having a 0.5 probability of occurrence.

15. The system of claim 14 wherein the transition detector samples a pseudorandom NRZ data stream including n data bits;
wherein the probability analyzer derives the mean data stream rate with a standard deviation as follows:

$\sigma = SQRT((P)(1-P)(n))$.

16. In a communications device integrated circuit (IC), a system for measuring a pseudorandom non-return to zero (NRZ) data transition count, the system comprising:
a transition detector having an input to sample a pseudorandom NRZ data stream and an output to supply a mean frequency of transitions (Fd);
a gating circuit having an output to supply a gate time period (Td); and,
a probability analyzer having an input to receive the mean frequency of transitions and an input to accept the gate time period, the probability analyzer comparing a mean transition count of the mean frequency of transitions to a transition probability (P) and supplying a compensated transition count at an output.

17. The system of claim 16 wherein the probability analyzer generates a mean transition count (Np) of frequency transitions over the time period Td and derives a mean data stream rate (B) as follows:

$$B=(Np)/(Td)(P).$$

18. The system of claim 17 wherein the probability analyzer supplies a compensated transition count (Nc) as follows:

$$Nc=Np/P.$$

19. The method of claim 18 wherein the transition detector supplies a mean frequency of transitions selected from the group including:
   positive transitions having a 0.25 probability of occurrence;
   negative transitions having a 0.25 probability of occurrence; and,
   both positive and negative transitions having a 0.5 probability of occurrence.

20. The method of claim 19 wherein the transition detector samples a pseudorandom NRZ data stream of n data bits;
   wherein the probability analyzer supplies a compensated transition count (Nc) with a standard deviation as follows:

$$\sigma=SQRT((P)(1-P)(n)).$$

21. A system for selecting the frequency range of a voltage controlled oscillator (VCO) for use in pseudorandom non-return to zero (NRZ) communications, the system comprising:
   a transition detector having an input to sample a pseudorandom NRZ data stream and an output to supply a mean frequency of transitions (Fd);
   a gating circuit having an output to supply a gate time period (Td);
   a probability analyzer having an input to receive the mean frequency of transitions and an input to accept the gate time period, the probability analyzer comparing a transition count of the mean frequency of transitions to a transition probability (P) and supplying a compensated transition count at an output;
   a decoder having a input to accept the compensated transition count, the decoder determining a frequency range corresponding to the compensated transition count and supplying a frequency range selection command at an output; and,
   a multiband voltage controlled oscillator having an input to accept a tuning voltage, an input to accept the frequency range selection command, and an output to supply a voltage controlled oscillator frequency responsive to the tuning voltage and frequency range selection.

22. The system of claim 21 wherein the probability analyzer generates a mean transition count (Np) of frequency transitions over the time period Td and derives a mean data stream rate (B) as follows:

$$B=(Np)/(Td)(P).$$

23. The system of claim 22 wherein the probability analyzer supplies a compensated transition count (Nc) as follows:

$$Nc=Np/P.$$

24. The method of claim 23 wherein the transition detector supplies a mean frequency of transitions selected from the group including:
   positive transitions having a 0.25 probability of occurrence;
   negative transitions having a 0.25 probability of occurrence; and,
   both positive and negative transitions having a 0.5 probability of occurrence.

25. The method of claim 24 wherein the transition detector samples a pseudorandom NRZ data stream of n data bits;
   wherein the probability analyzer supplies a compensated transition count (Nc) with a standard deviation as follows:

$$\sigma=SQRT((P)(1-P)(n)).$$

* * * * *